(12) United States Patent
Kaempf

(10) Patent No.: US 9,728,459 B2
(45) Date of Patent: Aug. 8, 2017

(54) METHOD FOR SINGULATING AN ASSEMBLAGE INTO SEMICONDUCTOR CHIPS, AND SEMICONDUCTOR CHIP

(71) Applicant: OSRAM Opto Semiconductors GmbH, Regensburg (DE)

(72) Inventor: Mathias Kaempf, Burglengenfeld (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/647,071

(22) PCT Filed: Nov. 8, 2013

(86) PCT No.: PCT/EP2013/073394
§ 371 (c)(1),
(2) Date: May 22, 2015

(87) PCT Pub. No.: WO2014/079708
PCT Pub. Date: May 30, 2014

(65) Prior Publication Data
US 2015/0303112 A1    Oct. 22, 2015

(30) Foreign Application Priority Data
Nov. 23, 2012   (DE) .................. 10 2012 111 358

(51) Int. Cl.
*H01L 21/00*        (2006.01)
*H01L 21/78*        (2006.01)
*H01L 33/00*        (2010.01)

(52) U.S. Cl.
CPC .......... *H01L 21/78* (2013.01); *H01L 33/0095* (2013.01); *H01L 2933/0016* (2013.01); *H01L 2933/0058* (2013.01)

(58) Field of Classification Search
CPC ....................................................... H01L 21/78
USPC ........................................ 257/620; 438/462
See application file for complete search history.

(56) References Cited

U.S. PATENT DOCUMENTS

| | | | |
|---|---|---|---|
| 3,720,997 A | 3/1973 | Black et al. | |
| 3,897,627 A | 8/1975 | Klatskin | |
| 7,687,322 B1 | 3/2010 | Doan et al. | |
| 8,241,932 B1 * | 8/2012 | Yu ....................... | H01L 25/0753 257/E21.122 |

(Continued)

FOREIGN PATENT DOCUMENTS

| | | |
|---|---|---|
| JP | S577139 A | 1/1982 |
| JP | H04206549 A | 7/1992 |

(Continued)

*Primary Examiner* — Igwe U Anya
(74) *Attorney, Agent, or Firm* — McDermott Will & Emery LLP

(57) ABSTRACT

A method for singulating an assemblage (1) into a plurality of semiconductor chips (10) is specified, wherein an assemblage comprising a carrier (4), a semiconductor layer sequence (2) and a metallic layer (3) is provided. Separating trenches (45) are formed in the carrier. The assemblage is subjected to mechanical loading, with the result that the metallic layer breaks along the separating trenches and the assemblage is singulated into semiconductor chips, wherein the singulated semiconductor chips each have part of the semiconductor layer sequence, of the carrier and of the metallic layer. A semiconductor chip (10) is furthermore specified.

13 Claims, 3 Drawing Sheets

(56) References Cited

U.S. PATENT DOCUMENTS

| | | | |
|---|---|---|---|
| 2006/0189098 A1* | 8/2006 | Edmond | H01L 33/0079 438/460 |
| 2007/0210327 A1* | 9/2007 | Ikeda | H01L 21/02395 257/103 |
| 2008/0194051 A1 | 8/2008 | Chu et al. | |
| 2010/0120228 A1* | 5/2010 | Saito | B23K 26/0604 438/463 |
| 2010/0120230 A1* | 5/2010 | Grivna | H01L 21/78 438/464 |
| 2010/0140630 A1* | 6/2010 | Hamaguchi | B23K 26/40 257/79 |
| 2011/0133216 A1* | 6/2011 | Sugawara | H01L 33/0079 257/88 |
| 2012/0100695 A1* | 4/2012 | Sugawara | H01L 33/0095 438/463 |
| 2012/0168714 A1* | 7/2012 | Chu | H01L 33/0079 257/13 |
| 2013/0069086 A1* | 3/2013 | Gunther | B28D 5/0011 257/88 |
| 2013/0084658 A1* | 4/2013 | Vaupel | H01L 21/78 438/14 |
| 2014/0094018 A1* | 4/2014 | Falvo | H01L 21/78 438/463 |

FOREIGN PATENT DOCUMENTS

| | | |
|---|---|---|
| JP | H06309950 A | 11/1994 |
| JP | H08316527 A | 11/1996 |
| JP | 2002198327 A | 7/2002 |
| JP | 2002231912 A | 8/2002 |
| JP | 2004247411 A | 9/2004 |
| JP | 2007220703 A | 8/2007 |
| JP | 2008042143 A | 2/2008 |
| JP | 2010114373 A | 5/2010 |
| JP | 2011522427 A | 7/2011 |
| JP | 2012089721 A | 5/2012 |
| JP | 2012109343 A | 6/2012 |
| JP | 2013058707 A | 3/2013 |
| JP | 2015532532 A | 11/2015 |
| WO | 2008/019377 A2 | 2/2008 |
| WO | 2010/111986 A1 | 10/2010 |
| WO | WO-2014052445 A1 | 4/2014 |

* cited by examiner

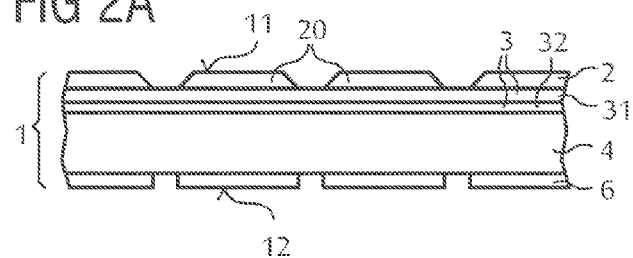
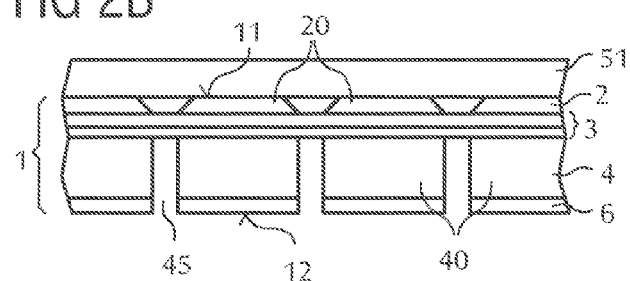
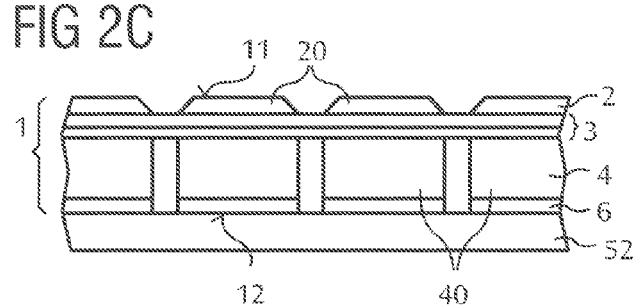
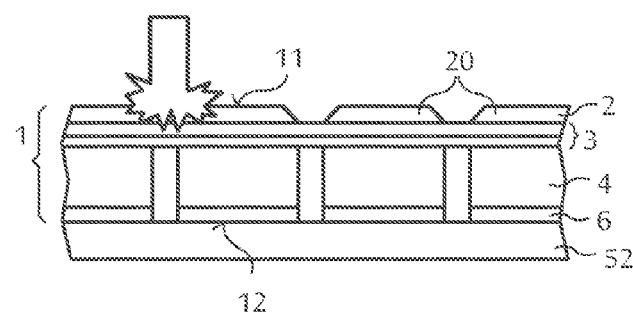
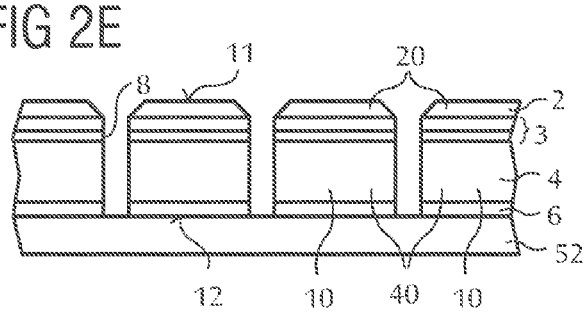

METHOD FOR SINGULATING AN ASSEMBLAGE INTO SEMICONDUCTOR CHIPS, AND SEMICONDUCTOR CHIP

The method relates to a method for singulating an assemblage into a plurality of semiconductor chips, and to a semiconductor chip of this type.

For singulating semiconductor wafers into semiconductor chips, various methods are known which involve severing the substrate material. However, many separating methods have different efficiencies for the different materials appearing, for example semiconductor material, metals or dielectric material. Moreover, it is often complicated to carry out the singulation step such that the singulated semiconductor chips are present in a systematic order for subsequent processes.

One object is to specify a singulation method which can be carried out in a simplified and reliable manner. Furthermore, the intention is to specify a semiconductor chip which can be produced in a simplified manner.

These objects are achieved, inter alia, by means of a method and respectively a semiconductor chip according to the independent patent claims. Configurations and expediencies are the subject matter of the dependent patent claims.

In accordance with at least one embodiment of the method for singulating an assemblage into a plurality of semiconductor chips, an assemblage is provided. The assemblage extends in a vertical direction between a first main surface and a second main surface.

In accordance with at least one embodiment of the method, the assemblage comprises a carrier. The carrier contains for example a semiconductor material, for instance silicon, germanium, gallium phosphide or gallium arsenide, or consists of such a material. The carrier can be embodied as electrically conductive or electrically insulating.

In accordance with at least one embodiment of the method, the assemblage comprises a semiconductor layer sequence. The semiconductor layer sequence is deposited for example epitaxially, for instance by means of MOCVD or MBE. The semiconductor layer sequence can be arranged on the carrier or on a growth substrate that differs from the carrier. By way of example, the semiconductor layer sequence contains an active region provided for generating radiation and/or for receiving radiation.

By way of example, the semiconductor layer sequence contains a compound semiconductor material. III-V compound semiconductor materials are particularly suitable for generating radiation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. It holds true here in each case that $0 \leq x \leq 1$, $0 \leq y \leq 1$ and $x+y \leq 1$, in particular where $x \neq 1$, $y \neq 1$, $x \neq 0$ and/or $y \neq 0$. With III-V compound semiconductor materials, in particular from the material systems mentioned, high internal quantum efficiencies can furthermore be obtained in the generation of radiation.

In accordance with at least one embodiment of the method, the assemblage comprises a metallic layer. The metallic layer can be embodied as a monolayer or in a multilayered fashion. By way of example, the metallic layer is electrically conductively connected to the semiconductor layer sequence. The metallic layer can furthermore be embodied as a mirror layer for the radiation to be generated or detected in the semiconductor layer sequence. By way of example, the reflectivity for said radiation is at least 60%.

In accordance with at least one embodiment of the method, separating trenches are formed in the carrier. In the singulated semiconductor chips, the side surfaces of the separating trenches form in particular the side surfaces delimiting the semiconductor chip in a lateral direction. In particular, the separating trenches are formed from that side of the carrier which faces away from the metallic layer.

A lateral direction is understood to mean a direction running along a main extension plane of the semiconductor layers of the semiconductor layer sequence.

In accordance with one embodiment variant, mesa trenches are already formed during the process of forming the separating trenches in the semiconductor layer sequence. The mesa trenches define the individual semiconductor bodies that emerge from the semiconductor layer sequence when the assemblage is singulated into semiconductor chips. By way of example, the mesa trenches extend completely through the semiconductor layer sequence. In other words, the semiconductor layer sequence is already severed during the process of forming the separating trenches. The separating trenches are formed in particular along the mesa trenches.

In accordance with an alternative configurational variant, the semiconductor layer sequence is also at least partly severed during the process of forming the separating trenches in the carrier. The individual semiconductor bodies and carrier bodies of the later singulated semiconductor chips are therefore defined in a common production step.

In accordance with at least one embodiment of the method, the separating trenches are formed by means of a chemical method. In particular, the trenches are formed by means of a plasma separating method, for example by means of deep reactive ion etching (DRIE). This method is also referred to as the "Bosch Process".

In accordance with at least one embodiment of the method, the separating trenches extend completely through the carrier. In other words, the assemblage is held together only by means of the metallic layer.

In accordance with at least one embodiment of the method, the assemblage is subjected to mechanical loading, such that the metallic layer flakes along the separating trenches and the assemblage is singulated into semiconductor chips. The mechanical loading can be effected sequentially or simultaneously for two or more separating trenches, in particular simultaneously for all the separating trenches. The singulated semiconductor chips in particular each have part of the semiconductor layer sequence, of the carrier and of the metallic layer.

In accordance with at least one embodiment of the method, the mechanical loading is effected by means of a pressure action on the assemblage in a direction running obliquely or perpendicularly to a main surface of the assemblage.

Mechanical loading is generally understood to mean a force action or pressure action that is suitable for inducing breaking. The mechanical loading is therefore carried out beyond the limit of the mechanical loading capacity of the pretreated assemblage. By contrast, an abrasive method such as sawing, for example, should not be regarded as a method in which an assemblage breaks on account of mechanical loading.

In accordance with at least one embodiment of the method, the mechanical loading is a liquid jet or a gas jet. The assemblage is therefore exposed to such a jet in order to obtain breaking of the assemblage. In particular, a compressed air jet method is suitable in which carbon dioxide is used as jet medium, for example $CO_2$ snow jets or dry ice jets.

Alternatively or additionally, the assemblage is subjected to a pressure wave. In particular, sound is suitable, for example ultrasound.

In at least one embodiment of the method, an assemblage is provided which comprises a carrier, a semiconductor layer sequence and a metallic layer. Separating trenches are formed in the carrier. The assemblage is subjected to mechanical loading, with the result that the metallic layer breaks along the separating trenches and the assemblage is singulated into semiconductor chips, wherein the singulated semiconductor chips each have part of the semiconductor layer sequence, of the carrier and of the metallic layer.

Therefore, a breaking edge arises in each case along the separating trenches, at which breaking edge the metallic layer is broken. Such a breaking edge is distinguished by an irregular structure.

It has been found that singulation of an assemblage into semiconductor chips by the method described can be carried out particularly simply, cost-effectively and in an easily automatable manner. In particular, the individual method steps can be carried out comparatively simply with high reliability and reproducibility. Moreover, the method is distinguished by low losses of yield. Furthermore, noble metals used in the production process can be separated and recycled in a simplified manner.

In accordance with at least one embodiment of the method, the metallic layer extends over the whole area of the assemblage before the assemblage is subjected to mechanical loading. That means that the metallic layer is totally unstructured in a lateral direction. In particular, after the separating trenches have been formed in the carrier, adjacent semiconductor chips are mechanically connected to one another in each case via the metallic layer.

In accordance with at least one embodiment of the method, forming the separating trenches and subjecting the assemblage to the mechanical loading are carried out from opposite sides of the assemblage. When forming the separating trenches and/or when subjecting the assemblage to the mechanical loading, the assemblage may be arranged on an auxiliary carrier. A suitable auxiliary carrier is a film, a rigid carrier or a plate, for example, in the case of which the semiconductor chips that are still situated in the assemblage or have already been singulated are sucked up by means of vacuum.

In accordance with at least one embodiment of the method, the assemblage is fixed to an auxiliary carrier before singulation and the semiconductor chips are present on the auxiliary carrier for further processing after singulation. In particular, the semiconductor chips are present in an ordered structure, for instance a matrix-shaped arrangement.

In accordance with at least one embodiment of the method, the semiconductor layer sequence, after the process of forming the separating trenches, is fixed to the auxiliary carrier at that side of the assemblage from which the separating trenches are introduced into the carrier. By way of example, the assemblage can be transferred from a first auxiliary carrier, on which the process of forming the separating trenches is carried out, to a second auxiliary carrier, on which the mechanical loading is exerted. A designation of the auxiliary carriers as first, second or third auxiliary carrier, for example, serves only for simplified description and does not necessarily imply an order in the use of the auxiliary carriers. Each of said auxiliary carriers can have at least one of the above-described features of the auxiliary carrier.

In accordance with at least one embodiment of the method, the assemblage is exposed to a mechanical stress, for instance a compressive stress or tensile stress, at least along a lateral direction, in particular along two mutually perpendicular directions, before being subjected to mechanical loading. By way of example, for this purpose, an auxiliary carrier embodied as a film can be expanded before the assemblage is fixed.

In accordance with at least one embodiment, a semiconductor chip comprises a semiconductor body, a carrier body and a metallic layer, which are arranged one on top of another in a vertical direction. The metallic layer has a breaking edge at at least one side surface of the semiconductor chip.

In accordance with at least one embodiment of the semiconductor chip, the metallic layer delimits the semiconductor chip on a side of the carrier body facing away from the semiconductor body in a vertical direction. In particular, the metallic layer can form a rear-side contact for the semiconductor chip.

In accordance with at least one embodiment of the semiconductor chip, the metallic layer is arranged between the carrier body and the semiconductor body. The metallic layer or a partial layer thereof can be embodied for example as a connection layer for a cohesive connection between the semiconductor body and the carrier body. In the case of a cohesive connection, the, preferably prefabricated, connection partners are held together by means of atomic and/or molecular forces. A cohesive connection can be obtained for example by means of a connection medium, for instance an adhesive or a solder. In general, a separation of the connection is accompanied by a destruction of the connection medium and/or of at least one of the connection partners.

The above-described method for singulating an assemblage into semiconductor chips is particularly suitable for the production of the semiconductor chip. Features described in association with the method can therefore also be used for the semiconductor chip, and vice versa.

Further features, configurations and expediencies will become apparent from the following description of the exemplary embodiments in association with the figures.

In the figures:

FIGS. 2A to 2E show a second exemplary embodiment of a method for singulating an assemblage on the basis of intermediate steps illustrated in schematic sectional view in each case;

Figure 3A:
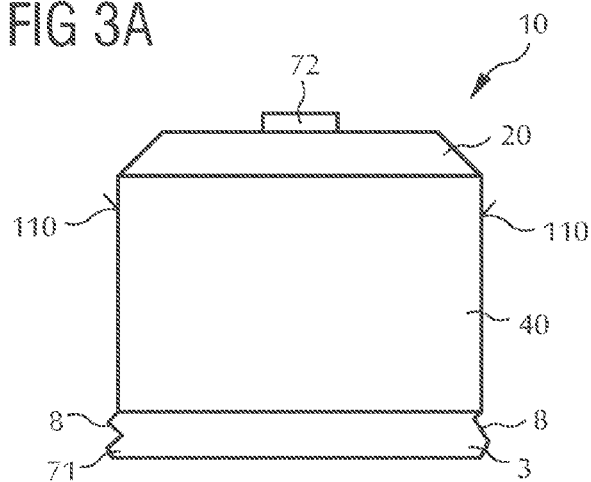
Figure 3B:
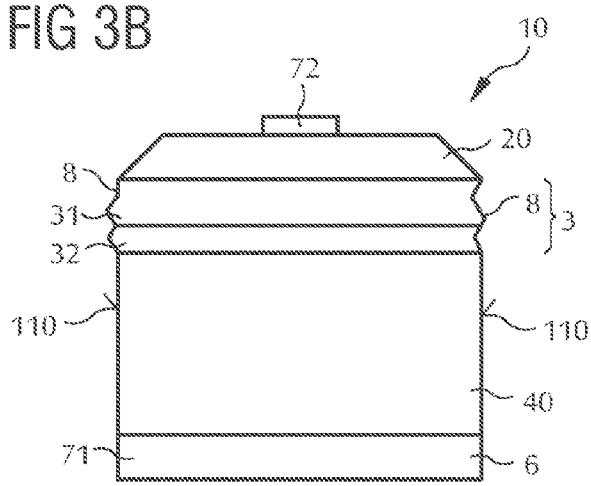
Figure 3C:
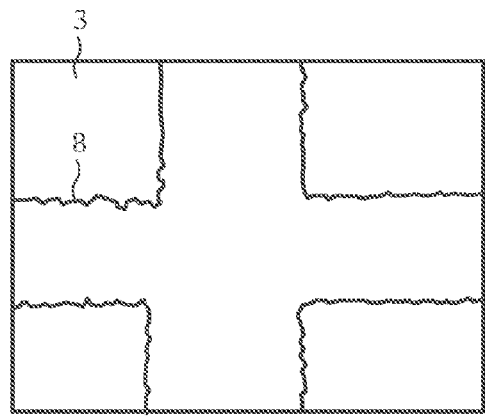

FIGS. 3A and 3B each show one exemplary embodiment of a semiconductor chip in schematic sectional view; and FIG. 3C shows a photographic image of a singulated assemblage in plan view.

Elements that are identical, of identical type or act identically are provided with the same reference signs in the figures. The figures and the size relationships of the elements illustrated in the figures among one another should not be regarded as to scale. Rather, individual elements and in particular layer thicknesses may be illustrated with exaggerated size in order to enable better illustration and/or to afford a better understanding.

Figure 1A:
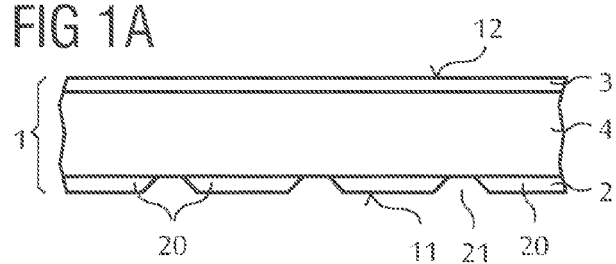
FIGS. 1A to 1E show a first exemplary embodiment of a method for singulating an assemblage on the basis of intermediate steps illustrated in schematic sectional view in each case.

In the case of the method in accordance with the first exemplary embodiment, as illustrated in FIG. 1A, an assemblage 1 is provided, which extends in a vertical direction between a first main surface 11 and a second main surface 12.

In this exemplary embodiment, the assemblage 1 comprises a carrier 4, a semiconductor layer sequence 2 and a metallic layer 3. The metallic layer 3 is arranged on that side of the carrier which faces away from the semiconductor layer sequence 2.

The carrier 4 contains for example a semiconductor material, for instance silicon, germanium, gallium phosphide or gallium arsenide, or consists of such a material. Alternatively, the carrier can for example contain sapphire or consist of such a material.

The semiconductor layer sequence 2 is preferably deposited epitaxially, for example by means of MBE or MOCVD. In particular, one of the III-V compound semiconductor materials mentioned above is suitable for the semiconductor layer sequence.

Details of the structural construction of the semiconductor layer sequence 2 are not explicitly shown, in order to simplify the illustration. Mesa trenches 21 are formed in the semiconductor layer sequence 2 and subdivide the semiconductor layer sequence 2 in each case into semiconductor bodies 20 separated from one another. The mesa trenches can be formed by wet-chemical or dry-chemical etching, for example.

The metallic layer 3 can be embodied as a monolayer or in a multilayered fashion. By way of example, the metallic layer can contain gold, aluminum, silver, platinum, palladium, rhodium or a metallic alloy comprising at least one of the materials mentioned, or can consist of such a material.

In a vertical direction, the metallic layer 3 preferably has a thickness of between 100 nm and 10 µm inclusive.

Figure 1B:
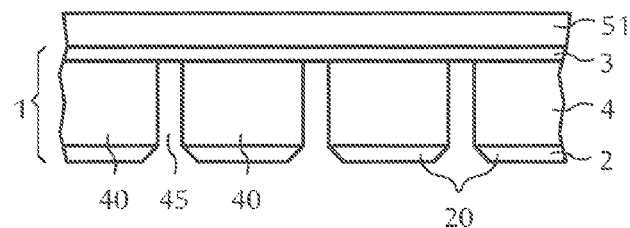

As illustrated in FIG. 1B, the carrier 4 is subdivided into individual carrier bodies by means of separating trenches 45.

The separating trenches 45 are preferably formed by means of a chemical method, in particular by means of a dry-chemical method. A plasma separating method, for example deep reactive ion etching, has proved to be particularly suitable, in particular for a silicon-based carrier 4. By means of deep reactive ion etching, separating trenches having a high aspect ratio, that is to say having a high ratio of the depth of the trenches to the width of the trenches, can be produced simply and reliably. Alternatively, however, a different wet-chemical or dry-chemical etching method or the combination of a wet-chemical etching method with a dry-chemical etching method can also be employed.

In the exemplary embodiment shown, the separating trenches 45 are formed in the region of the mesa trenches 21. In other words, only material of the carrier is removed during the process of forming the separating trenches.

In a departure from this, however, it is also conceivable that, before the process of forming the separating trenches 45, the semiconductor layer sequence 2 has not yet been subdivided into individual semiconductor bodies, or at least has not been completely subdivided into individual semiconductor bodies. In this case, the separating trenches are formed through the semiconductor layer sequence 2 and the carrier 4.

The separating trenches 45 are formed from the first main surface 11. On the second main surface 12 opposite the first main surface 11, the assemblage 1 is fixed to a first auxiliary carrier 51. The first auxiliary carrier 51 can be for example a flexible carrier, for instance a film, or a rigid carrier.

After the process of forming the separating trenches 45, the carrier bodies 40 are still mechanically stably connected to one another via the metallic layer 3. The stability of the relative position of the individual carrier bodies 40 is thus ensured in a simplified manner by means of the metallic layer 3. In other words, after the carrier 4 has been severed, the assemblage 1 is still held together by a layer that remains in the singulated and completed semiconductor chips.

Figure 1C:
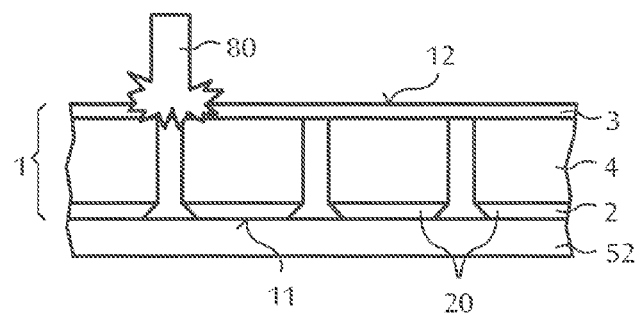

After the process of forming the separating trenches, the assemblage 1 is transferred from the first auxiliary carrier 51 to a second auxiliary carrier 52. The assemblage 1 now bears on the side of the first main surface 11, such that the second main surface 12 is freely accessible (FIG. 1C). The carrier bodies 40 are in each case arranged between the metallic layer 3 and the second auxiliary carrier 52.

The transfer to the second auxiliary carrier 52 can be carried out such that the assemblage 1 is exposed to a mechanical stress in a lateral direction, for example a tensile stress or compressive stress. In the course of subsequently being subjected to mechanical loading, the assemblage is already prestressed in this case, for example by the expanding of the auxiliary carrier embodied as a film. The singulation can be supported as a result. However, such prestressing can also be dispensed with.

The assemblage 1, in particular the metallic layer 3, is subjected to mechanical loading from the second main surface 12. A liquid jet 80, for example, is suitable as mechanical loading. In particular, water or distilled water is suitable as liquid. The liquid jet can be exerted on the assemblage 1 permanently or in a pulsating manner.

Alternatively, a gas jet having sufficiently high pressure, for example compressed air, nitrogen or a reactive gas, can also be employed. A compressed air jet method with carbon dioxide as jet medium, for example $CO_2$ snow jets or dry ice jets, is also suitable for inducing mechanical loading that induces breaking.

Furthermore, mechanical application of sound can also be employed as mechanical loading. In the case of application of sound, the frequency is expediently implemented in a manner adapted to the material and geometric conditions of the assemblage 1.

A combination of two or more of the mechanical loadings mentioned can also be employed, for example a high-pressure water jet subjected to ultrasound.

The mechanical loading is effected beyond the loading limit of the metallic layer, such that the metallic layer breaks along the separating trenches 45. Breaking edges 8 therefore arise in the region of the separating trenches 8 and delimit the metallic layer 3 on the individual carrier bodies 40 in each case in a lateral direction.

Figure 1D:
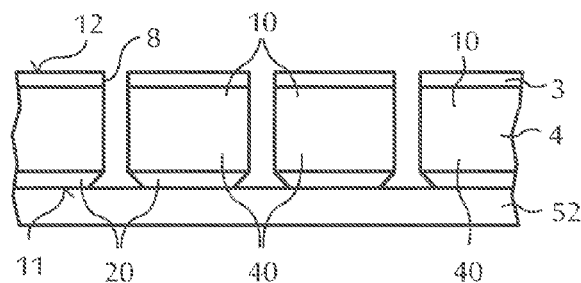
Figure 1E:
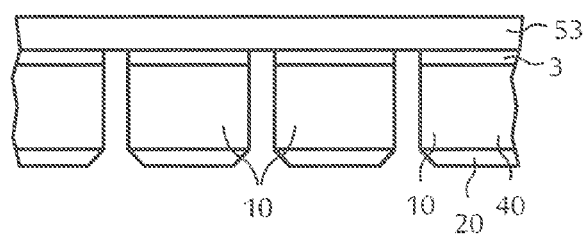

After singulation, the semiconductor chips 10 are present on the second auxiliary carrier 52 for further processing in a systematic order, in particular in a matrix-shaped manner (FIG. 1D). Depending on the further method steps, a further transfer to a third auxiliary carrier 53 can optionally be carried out, as illustrated in FIG. 1E. The semiconductor chips 10 are present on the third auxiliary carrier 53 in such a way that the first main surface 11 is arranged on the side facing away from the third auxiliary carrier 53. The semiconductor body 20 is therefore arranged on that side of the carrier 4 which faces away from the third auxiliary carrier.

The method described does not necessitate a production step in which the metallic layer 3 is structured, for example by means of a photolithographic method. Furthermore, for forming the separating trenches a method may be employed which is not suitable for severing the metallic layer or would be impracticable at least on account of an excessively low removal rate.

During the process of forming the separating trenches 45, therefore, only readily removable material of the carrier 4 has to be removed. As a result, predefined breaking locations of the assemblage 1 are defined for the later singulation, along which predefined breaking locations the metallic layer 3 breaks as a result of the assemblage being subjected to mechanical loading.

A completed semiconductor chip 10 is shown schematically in sectional view in FIG. 3A. The semiconductor chip 10 comprises a carrier body 40, a semiconductor body 20 having a semiconductor layer sequence, and a metallic layer 3. The semiconductor chip 10 is delimited by side surfaces 110 in a lateral direction.

The metallic layer 3 forms a rear-side contact 71 of the semiconductor chip. A front-side contact 72 is arranged on a side of the semiconductor body 2 facing away from the carrier body 40. In the case of a semiconductor chip embodied as a radiation emitter, as a result of an external electrical voltage being applied between the contacts 71, 72, charge carriers can be injected from different sides into the active region of the semiconductor chip 20 and recombine there with emission of radiation. The semiconductor chip can be embodied for example as a luminescence diode, for instance a laser diode or a light emitting diode. In the case of a semiconductor chip embodied as a radiation receiver, a signal of the semiconductor chip can be tapped off at the contacts 71, 72.

The carrier body 40 can emerge from a growth substrate for the semiconductor layer sequence of the semiconductor body 20 or from a carrier that differs from the growth substrate.

The metallic layer 3 has breaking edges 8 in each case at the side surfaces 110. A photographic plan view of the singulated assemblage is shown in FIG. 3C, wherein the irregular structure of the breaking edge 8 caused by the breaking is clearly discernible.

The second exemplary embodiment illustrated in FIGS. 2A to 2E substantially corresponds to the first exemplary embodiment described in association with FIGS. 1A to 1E.

In contrast thereto, as illustrated in FIG. 2A, an assemblage 1 is provided in which the metallic layer 3 is arranged between the carrier 4 and the semiconductor layer sequence 2. In this exemplary embodiment, the metallic layer 3 comprises a mirror layer 31 facing the semiconductor layer sequence and a connection layer 32. The connection layer can be a solder layer, for example. The carrier is fixed to the semiconductor layer sequence by means of the connection layer. The carrier is therefore not the growth substrate for the semiconductor layer sequence.

Furthermore, the assemblage 1 comprises a further metallic layer 6 on that side of the carrier 4 which faces away from the semiconductor layer sequence 2. The further metallic layer is structured into mutually separated metal surfaces in a lateral direction.

As illustrated in FIG. 2B, separating trenches 45 are formed in the carrier. This can be carried out in the manner as described in association with FIG. 2B. After the process of forming the separating trenches 45, therefore, the assemblage is connected via the metallic layer 3 situated between the semiconductor layer sequence 2 and the carrier 4.

The transfer from the first auxiliary carrier 51 to the second auxiliary carrier 52 and subjecting the assemblage to mechanical loading, illustrated in FIGS. 2C and 2D, can be carried out as described in association with the first exemplary embodiment.

As illustrated in FIG. 2E, the singulated semiconductor chips 10 are present on the second auxiliary carrier 52 for further processing, the first main surface 11 facing away from the second auxiliary carrier 52.

The semiconductor chip 10 thus completed is shown schematically in sectional view in FIG. 3B. In contrast to the semiconductor chip 10 illustrated in FIG. 3A, the metallic layer 3 is arranged between the semiconductor body 20 and the carrier body 40. The further metallic layer 6 forms the rear-side contact 71. Radiation generated or to be detected during the operation of the semiconductor chip in the semiconductor body 20, in particular in an active region of the semiconductor body (not explicitly illustrated), can be reflected at the mirror layer 31.

The method described is largely independent of the specific configuration of the semiconductor chips to be produced. By way of example, the semiconductor chips can also have two front-side or two rear-side contacts.

Furthermore, on the semiconductor layer sequence 2 or the semiconductor body 20 it is possible to arrange one or more further layers, for example a passivation layer, for instance an oxide layer or a nitride layer and/or a layer containing a TCO (Transparent Conductive Oxide) material, and/or a layer containing a phosphor provided for radiation conversion.

This patent application claims the priority of German Patent Application 10 2012 111 358.0, the disclosure content of which is hereby incorporated by reference.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for singulating an assemblage into a plurality of semiconductor chips comprising the following steps:
   a) providing an assemblage comprising a carrier, a semiconductor layer sequence and a metallic layer;
   b) forming separating trenches in the carrier; and
   c) subjecting the assemblage to mechanical loading, with the result that the metallic layer breaks along the separating trenches and the assemblage is singulated into semiconductor chips,
   wherein the singulated semiconductor chips each have part of the semiconductor layer sequence, of the carrier and of the metallic layer,
   wherein the metallic layer is arranged between the semiconductor layer sequence and the carrier,
   wherein after step b) the metallic layer is the only layer of the assemblage via which carrier bodies of the carrier are still mechanically stably connected to one another and
   wherein the metallic layer remains in the singulated and completed semiconductor chips.

2. The method according to claim 1, wherein the mechanical loading is effected by means of a pressure action on the assemblage in a direction running obliquely or perpendicularly to a main surface of the assemblage.

3. The method according to claim 1, wherein the metallic layer extends over the whole area of the assemblage before step c).

4. The method according to claim 1, wherein the separating trenches are formed by means of a chemical method.

5. The method according to claim 1, wherein the separating trenches extend completely through the carrier after step b).

6. The method according to claim 1, wherein steps b) and c) are carried out from opposite sides of the assemblage.

7. The method according to claim 1, wherein the assemblage is exposed to a mechanical stress at least along a lateral direction before step c).

8. The method according to claim 1, wherein the assemblage is fixed to an auxiliary carrier before singulation and the semiconductor chips are present on the auxiliary carrier for further processing after singulation.

9. The method according to claim 8, wherein the semiconductor layer sequence, after step b), is fixed to the auxiliary carrier at that side of the assemblage from which the separating trenches are introduced into the carrier.

10. The method according to claim 1, wherein the assemblage is exposed to a liquid jet or gas jet in step c).

11. The method according to claim 10, wherein carbon dioxide is used as jet medium.

12. The method according to claim 1, wherein the assemblage is subjected to a pressure wave in step c).

13. A method for singulating an assemblage into a plurality of semiconductor chips comprising the following steps:
   a) providing an assemblage comprising a carrier, a semiconductor layer sequence and a metallic layer;
   b) forming separating trenches in the carrier; and
   c) subjecting the assemblage to mechanical loading, with the result that the metallic layer breaks along the separating trenches and the assemblage is singulated into semiconductor chips,
wherein the singulated semiconductor chips each have part of the semiconductor layer sequence, of the carrier and of the metallic layer,
wherein the separating trenches extend completely through the carrier after step b), and
wherein the assemblage is exposed to a mechanical stress at least along a lateral direction after step b) and before step c).

* * * * *